(12) United States Patent
Liu et al.

(10) Patent No.: US 10,386,947 B2
(45) Date of Patent: Aug. 20, 2019

(54) ARRAY SUBSTRATE, METHOD FOR MANUFACTURING THE SAME, DISPLAY PANEL AND TOUCH PANEL

(71) Applicant: BOE TECHNOLOGY GROUP CO., LTD., Beijing (CN)

(72) Inventors: Zhen Liu, Beijing (CN); Feng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/525,733

(22) PCT Filed: May 31, 2016

(86) PCT No.: PCT/CN2016/084083
§ 371 (c)(1),
(2) Date: May 10, 2017

(87) PCT Pub. No.: WO2017/143687
PCT Pub. Date: Aug. 31, 2017

(65) Prior Publication Data
US 2018/0348923 A1    Dec. 6, 2018

(30) Foreign Application Priority Data

Feb. 24, 2016    (CN) .......................... 2016 1 0101464

(51) Int. Cl.
*G06F 3/041*    (2006.01)
*G02B 5/26*    (2006.01)
(Continued)

(52) U.S. Cl.
CPC ......... *G06F 3/0412* (2013.01); *G02B 5/1809* (2013.01); *G02B 5/1819* (2013.01);
(Continued)

(58) Field of Classification Search
CPC ...... G06F 3/041; G06F 3/0412; G06F 3/0421; G06F 3/042; G06F 3/044; G06F 2203/04103
See application file for complete search history.

(56) References Cited

U.S. PATENT DOCUMENTS 7,145,614 B2 *  12/2006  Lee .................. B82Y 20/00
                                                    349/106
7,450,196 B2 *  11/2008  Lee .................. B82Y 20/00
                                                    349/106
(Continued)

FOREIGN PATENT DOCUMENTS

CN    101963719 A    2/2011
CN    102096224 A    6/2011
(Continued)

OTHER PUBLICATIONS

International Search Report and Written Opinion for Application No. PCT/CN2016/084083, dated Oct. 28, 2016, 12 Pages.
(Continued)

*Primary Examiner* — Vijay Shankar
(74) *Attorney, Agent, or Firm* — Brooks Kushman P.C.

(57) ABSTRACT

An array substrate and a method for manufacturing the same, a display panel and a touch panel are provided. The array substrate includes multiple pixel regions arranged in an array. Multiple metal patterns are provided within each pixel region. Each metal pattern includes multiple metal units which are periodically arranged. The multiple metal patterns are capable of reflectively filtering light from ambient environment or from a front light source. Each pixel region includes multiple sub-pixel regions which are in a one-to-one correspondence with the multiple metal patterns within the pixel region. Metal units of metal patterns cor- (Continued)

responding to sub-pixel regions of different colors have different arrangement periods.

16 Claims, 5 Drawing Sheets (51) Int. Cl.
  *G02F 1/1335* (2006.01)
  *G02F 1/1362* (2006.01)
  *G02F 1/1368* (2006.01)
  *H01L 27/12* (2006.01)
  *G06F 3/044* (2006.01)
  *G02B 5/18* (2006.01)
  *G02B 5/20* (2006.01)
  *G02F 1/1333* (2006.01)
  *G02F 1/1343* (2006.01)

(52) U.S. Cl.
  CPC ............ *G02B 5/201* (2013.01); *G02B 5/26* (2013.01); *G02F 1/1368* (2013.01); *G02F 1/133553* (2013.01); *G02F 1/136286* (2013.01); *G06F 3/044* (2013.01); *H01L 27/124* (2013.01); *H01L 27/127* (2013.01); *G02F 1/13338* (2013.01); *G02F 1/13439* (2013.01); *G02F 2203/34* (2013.01); *G06F 2203/04103* (2013.01)

(56) References Cited

U.S. PATENT DOCUMENTS 7,675,591 B2 *   3/2010   Kim ................. G02F 1/133555
                                                           349/104
2003/0218704 A1   11/2003   Lee et al.
2008/0158486 A1   7/2008   Kim et al.
2011/0102715 A1   5/2011   Park et al.
2011/0149214 A1   6/2011   Yoon
2014/0176413 A1   6/2014   Jung et al.
2014/0233126 A1   8/2014   Ye et al.
2015/0316694 A1   11/2015   Wu et al.
2017/0045984 A1   2/2017   Lu et al.
2017/0336662 A1   11/2017   Zhang

FOREIGN PATENT DOCUMENTS

| | | |
|---|---|---|
| CN | 102103224 A | 6/2011 |
| CN | 102789021 A | 11/2012 |
| CN | 103472516 A | 12/2013 |
| CN | 103513316 A | 1/2014 |
| CN | 103885240 A | 6/2014 |
| CN | 104716144 A | 6/2015 |
| CN | 105045011 A | 11/2015 |
| CN | 105572955 A | 5/2016 |
| CN | 105607334 A | 5/2016 |
| EP | 1359459 A2 | 11/2003 |
| EP | 1939672 A1 | 7/2008 |
| WO | 2012162880 A1 | 12/2012 |

OTHER PUBLICATIONS

First Office Action for Chinese Patent Application No. 201610101464.0, dated Mar. 22, 2018, 9 Pages.

* cited by examiner

ARRAY SUBSTRATE, METHOD FOR MANUFACTURING THE SAME, DISPLAY PANEL AND TOUCH PANEL

CROSS-REFERENCE TO RELATED APPLICATION APPLICATIONS

This application is the U.S. national phase of PCT Application No. PCT/CN2016/084083 filed on May 31, 2016, which claims priority to Chinese Patent Application No. 201610101464.0 filed on Feb. 24, 2016, the disclosures of which are incorporated in their entirety by reference herein.

TECHNICAL FIELD

The present disclosure relates to the field of display technology, in particular to an array substrate and a method for manufacturing the same, a display panel and a touch panel.

BACKGROUND

Nowadays, thin film transistor liquid crystal display (TFT-LCD) holds large market share among various flat displays due to its advantages such as small volume, low power consumption and free of radiation.

Color filter is an important component of the liquid crystal display. In the liquid crystal display, light emitted from the backlight module is processed by the color filter and a colorful image is then presented. The color filter is mostly made of an organic pigment or dye. A common method for manufacturing the color filter is described as follows: firstly, a black matrix is formed on a transparent substrate, and then red filters, green filters and blue filters are formed separately. This complicated manufacturing procedure leads to high cost of the liquid crystal display.

SUMMARY

The present disclosure provides an array substrate and a method for manufacturing the same, a display panel and a touch panel, which can simplify the manufacturing procedure of the liquid crystal display panel and reduce the cost of the liquid crystal display panel.

In one aspect, an array substrate is provided. The array substrate includes multiple pixel regions arranged in an array. Multiple metal patterns are provided within each pixel region, each metal pattern includes multiple metal units which are periodically arranged. of the metal patterns are used to reflectively filter light from ambient environment or from a front light source. Each pixel region includes multiple sub-pixel regions which are in a one-to-one correspondence with the multiple metal patterns within the pixel region, and metal units of metal patterns corresponding to sub-pixel regions of different colors have different arrangement periods.

Optionally, the metal units are rectangular in shape, and the arrangement period of the metal units is a sum of a distance between two adjacent metal units and a width of the metal units.

Optionally, the array substrate includes red sub-pixel regions, green sub-pixel regions and blue sub-pixel regions.

The metal units within each red sub-pixel region have a width ranging from 490 nm to 510 nm and an arrangement period ranging from 530 nm to 550 nm, the metal units within each green sub-pixel region have a width ranging from 440 nm to 460 nm and an arrangement period ranging from 475 nm to 495 nm, and the metal units within each blue sub-pixel region have a width ranging from 290 nm to 305 nm and an arrangement period ranging from 315 nm to 330 nm.

Optionally, the metal units within each red sub-pixel region have a width of 500 nm and an arrangement period of 540 nm, the metal units within each green sub-pixel region have a width of 450 nm and an arrangement period of 485 nm, and the metal units within each blue sub-pixel region have a width of 300 nm and an arrangement period of 320 nm.

Optionally, the array substrate includes yellow sub-pixel regions, magenta sub-pixel regions and cyan sub-pixel regions.

The metal units within each yellow sub-pixel region have a width ranging from 50 nm to 70 nm and an arrangement period ranging from 190 nm to 210 nm, the metal units within each magenta sub-pixel region have a width ranging from 66 nm to 86 nm and an arrangement period ranging from 190 nm to 210 nm, and the metal units within each cyan sub-pixel region have a width ranging from 82 nm to 102 nm and an arrangement period ranging from 190 nm to 210 nm.

Optionally, the metal units within each yellow sub-pixel region have a width of 60 nm and an arrangement period of 200 nm, the metal units within each magenta sub-pixel region have a width of 76 nm and an arrangement period of 200 nm, and the metal units within each cyan sub-pixel region have a width of 92 nm and an arrangement period of 200 nm.

Optionally, the metal units are circular in shape, and the arrangement period of the metal units is a sum of a minimum distance between two adjacent metal units and a diameter of the metal units.

Optionally, the metal units have a thickness ranging from 100 nm to 220 nm.

Optionally, the thickness of the metal units is 120 nm.

Optionally, the array substrate includes multiple thin film transistors which respectively correspond to the sub-pixel regions, and all metal units within each sub-pixel region are connected to a drain electrode of a corresponding thin film transistor corresponding to the sub-pixel region.

Optionally, adjacent metal units in the multiple metal units corresponding to each sub-pixel region are connected with each other through a metal connection structure made of a same material as the metal units.

Optionally, the array substrate also includes touch electrodes. The touch electrodes and the metal patterns are located at a same layer and made of a same material.

Optionally, the array substrate also includes multiple thin film transistors, the touch electrodes are located above the thin film transistors, and orthographic projections of the thin film transistors onto the array substrate are located within orthographic projections of the touch electrodes onto the array substrate.

The present disclosure also provides a display panel including the above-mentioned array substrate.

The present disclosure also provides a touch panel including the above-mentioned array substrate.

The present disclosure also provides a method for manufacturing an array substrate, including the step of: forming multiple metal patterns within each pixel region of the array substrate. Each metal pattern includes multiple metal units which are periodically arranged, and the multiple metal patterns are used to reflectively filter light from ambient environment or from a front light source. Multiple sub-pixel regions within each pixel region are in a one-to-one correspondence with the multiple metal patterns within the pixel region, and metal units of metal patterns corresponding to sub-pixel regions of different colors have different arrangement periods.

Optionally, the array substrate also includes multiple thin film transistors, and the step of forming the multiple metal patterns within each pixel region of the array substrate includes: forming multiple metal units within each sub-pixel region, where each of the multiple metal units is connected to a drain electrode of a thin film transistor corresponding to the sub-pixel region.

Optionally, the array substrate also includes touch electrodes, and the step of forming the multiple metal patterns within each pixel region of the array substrate further includes: forming the touch electrodes and the metal patterns simultaneously by one patterning process.

In the technical solution of the present disclosure, the metal patterns are capable of reflectively filtering the light from the ambient environment or from the front light source. Lights of different colors can be filtered out by designing the metal units with different widths and arranging the metal units according to different arrangement periods; hence, the metal patterns can function as a color filter layer and there is no need to prepare filters of different colors separately, the manufacturing procedure of the liquid crystal display can be simplified and the cost of the liquid crystal display can be reduced. Furthermore, the thickness of the display panel can be decreased since no additional color filter layer needs to be provided.

REFERENCE NUMERALS

100, 104: base substrate; 102: reflective electrode; 103: color filter; 105: polarizer; 106: asymmetry forward scattering film; 1: gate metal layer; 2: gate insulation layer; 3: active layer; 4: source and drain metal layer; 5: passivation layer; 6: planarization layer; 71: metal units; 72: touch driving electrode; 73: touch sensing electrode

DETAILED DESCRIPTION

In order to clarify technical solutions and advantageous, detailed description of the present disclosure is set forth hereinafter with reference to the drawings and embodiments.

Figure 1:
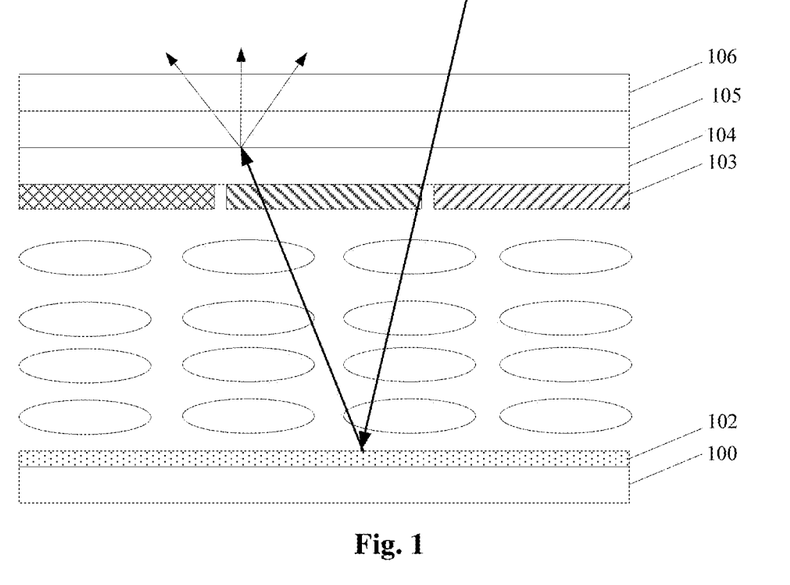
FIG. 1 is a schematic structure diagram of a reflective liquid crystal display panel in related technique.

A reflective liquid crystal display panel in related technique is shown in FIG. 1, in which color filters are made of organic pigments or dyes. Red filters, green filters and blue filters need to be prepared separately. The preparation procedure is complicated, the cost is high, and only a low filtering efficiency about 30% can be realized.

In view of this, the present disclosure provides an array substrate and a method for manufacturing the same, a display panel and a touch panel, which can simplify the manufacturing procedure of the liquid crystal display panel and reduce the cost of the liquid crystal display panel.

The present disclosure provides, in some embodiments, an array substrate. The array substrate includes multiple pixel regions arranged in an array. Multiple metal patterns are provided within each pixel region, and each metal pattern includes multiple metal units which are periodically arranged. The metal patterns are capable of reflectively filtering light from ambient environment or from a front light source. Each pixel region includes multiple sub-pixel regions which are in a one-to-one correspondence with the multiple metal patterns within the pixel region, and the metal units of the metal patterns corresponding to the sub-pixel regions of different colors have different arrangement periods.

In the embodiments, the metal patterns are capable of reflectively filtering light from the ambient environment or from the front light source. Lights of different colors can be filtered out by designing the metal units with different widths and arranging the metal units according to different arrangement periods; hence, the metal patterns can function as a color filter layer and there is no need to prepare filters of different colors separately, the manufacturing procedure of the liquid crystal display can be simplified and the cost of the liquid crystal display can be reduced. Furthermore, the thickness of the display panel can be decreased since no additional color filter layer needs to be provided.

Specifically, in each sub-pixel region of the array substrate, the metal units of the metal pattern are arranged in a matrix. The metal units of the metal patterns in the sub-pixel regions of different colors have different arrangement periods and different widths. The longer a wavelength of light of a color corresponding to one sub-pixel region, the larger the arrangement period of the metal units of the metal pattern in the sub-pixel region; and the longer the wavelength of light of the color corresponding to the sub-pixel region, the larger the width of the metal units of the metal pattern in the sub-pixel region.

In some embodiments of the present disclosure, the metal units may be circular, square or rectangular in shape.

Figure 2:
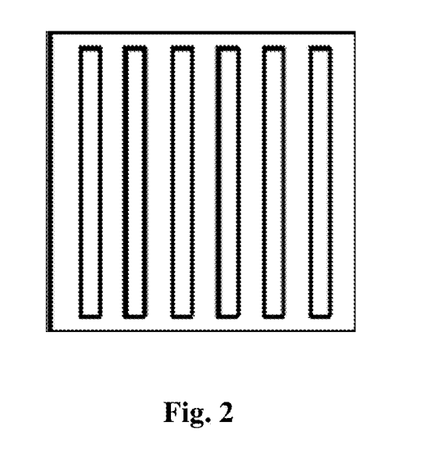
FIG. 2 and FIG. 3 show a schematic structure of a single metal pattern according to some embodiments of the present disclosure.

In some embodiments of the present disclosure, as shown in FIG. 2, the metal units are rectangular in shape, and the arrangement period of the metal units is the sum of a distance between two adjacent metal units and a width of the metal units.

Further, in the case that the metal units are rectangular in shape, the array substrate may include red sub-pixel regions, green sub-pixel regions and blue sub-pixel regions.

The metal units within each red sub-pixel region have a width ranging from 490 nm to 510 nm and an arrangement period ranging from 530 nm to 550 nm, the metal units within each green sub-pixel region have a width ranging from 440 nm to 460 nm and an arrangement period ranging from 475 nm to 495 nm, and the metal units within each blue sub-pixel region have a width ranging from 290 nm to 305 nm and an arrangement period ranging from 315 nm to 330 nm.

Optionally, the metal units within each red sub-pixel region have a width of 500 nm and an arrangement period of 540 nm, the metal units within each green sub-pixel region have a width of 450 nm and an arrangement period of 485 nm, and the metal units within each blue sub-pixel region have a width of 300 nm and an arrangement period of 320 nm.

Further, in the case that the metal units are rectangular in shape, the array substrate may include yellow sub-pixel regions, magenta sub-pixel regions and cyan sub-pixel regions.

The metal units within each yellow sub-pixel region have a width ranging from 50 nm to 70 nm and an arrangement period ranging from 190 nm to 210 nm, the metal units within each magenta sub-pixel region have a width ranging from 66 nm to 86 nm and an arrangement period ranging from 190 nm to 210 nm, and the metal units within each cyan sub-pixel region have a width ranging from 82 nm to 102 nm and an arrangement period ranging from 190 nm to 210 nm.

Optionally, the metal units within each yellow sub-pixel region have a width of 60 nm and an arrangement period of 200 nm, the metal units within each magenta sub-pixel region have a width of 76 nm and an arrangement period of 200 nm, and the metal units within each cyan sub-pixel region have a width of 92 nm and an arrangement period of 200 nm.

Figures 3, 4:
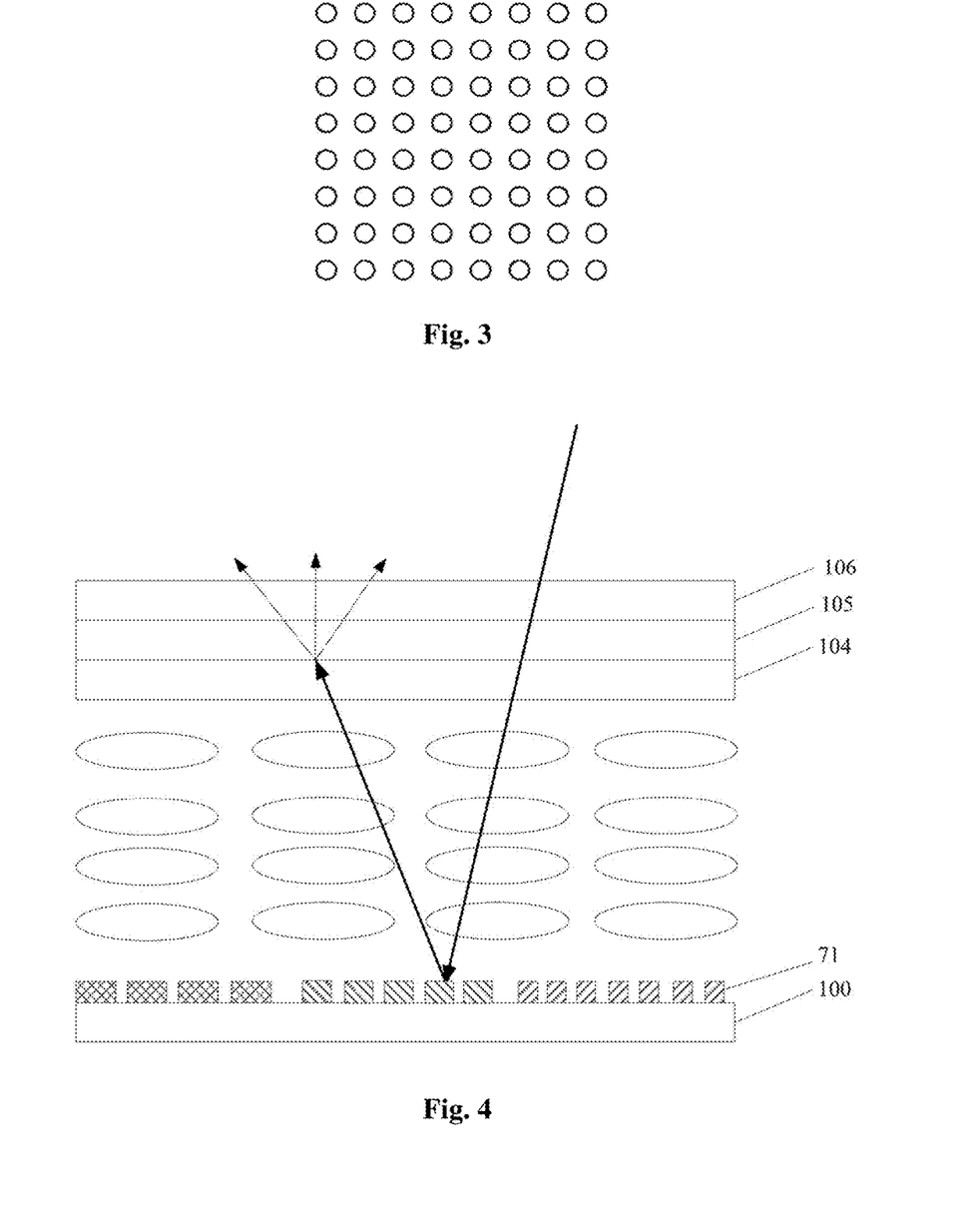
FIG. 4 is a schematic structure diagram of a reflective liquid crystal display panel according to some embodiments of the present disclosure.

In some embodiments of the present disclosure, as shown in FIG. 3, the metal units are circular in shape, and the arrangement period of the metal units is the sum of a minimum distance between two adjacent metal units and a diameter of the metal units.

Further, in the case that the metal units are circular in shape, the array substrate may include red sub-pixel regions, green sub-pixel regions and blue sub-pixel regions.

The metal units within each red sub-pixel region have a diameter ranging from 160 nm to 280 nm and an arrangement period ranging from 410 nm to 430 nm, the metal units within each green sub-pixel region have a diameter ranging from 120 nm to 240 nm and an arrangement period ranging from 330 nm to 350 nm, and the metal units within each blue sub-pixel region have a diameter ranging from 100 nm to 180 nm and an arrangement period ranging from 250 nm to 270 nm.

Optionally, the diameter of the metal units within each red sub-pixel region is 220 nm; the diameter of the metal units within each green sub-pixel region is 180 nm; and the diameter of the metal units within each blue sub-pixel region is 140 nm.

Further, the metal units have a thickness ranging from 100 nm to 220 nm. Optionally, the thickness of the metal units is 120 nm.

Further, the array substrate is further provided with multiple thin film transistors which respectively correspond to the multiple sub-pixel regions. All the metal units within each sub-pixel region are connected to a drain electrode of the thin film transistor corresponding to the sub-pixel region. In this way, the metal patterns may also act as pixel electrodes, and a patterning process for forming the pixel electrodes can be omitted, thereby further simplifying the manufacturing procedure of the array substrate and reducing the cost of the array substrate.

Further, the array substrate is further provided with touch electrodes. The touch electrodes are located at an identical layer to the metal patterns and are made of an identical material to the metal patterns. The touch electrodes and the metal patterns can be formed simultaneously by one patterning process, thereby further simplifying the manufacturing procedure of the array substrate and reducing the cost of the array substrate.

Further, optionally, the touch electrodes are located above the thin film transistors, and orthographic projections of the thin film transistors onto the array substrate are located within orthographic projections of the touch electrodes onto the array substrate. Thus, the thin film transistors can be shielded by the touch electrodes and the property of the thin film transistors may not be influenced by light irradiation.

The present disclosure also provides, in some embodiments, a display panel including the array substrate as described above.

The present disclosure also provides, in some embodiments, a touch panel including the array substrate as described above.

The present disclosure also provides, in some embodiments, a method for manufacturing an array substrate, which includes the following step: forming multiple metal patterns in each pixel region of the array substrate. Each metal pattern includes multiple metal units which are periodically arranged. The metal patterns are capable of reflectively filtering light from ambient environment or from a front light source. Each pixel region includes multiple sub-pixel regions which are in a one-to-one correspondence with the multiple metal patterns in the pixel region, and metal units of the metal patterns corresponding to the sub-pixel regions of different colors have different arrangement periods.

In the embodiments, the metal patterns are capable of reflectively filtering light from the ambient environment or from the front light source. Lights of different colors can be filtered out by designing the metal units with different widths and arranging the metal units according to different arrangement periods; hence, the metal patterns can function as a color filter layer and there is no need to prepare filters of different colors separately, the manufacturing procedure of the liquid crystal display can be simplified and the cost of the liquid crystal display can be reduced. Furthermore, the thickness of the display panel can be decreased since no additional color filter layer needs to be provided.

Further, the array substrate is further provided with multiple thin film transistors. The step of forming the multiple metal patterns in each pixel region of the array substrate further includes a step of forming multiple metal units in each sub-pixel region, where the multiple metal units are all connected to a drain electrode of a thin film transistor corresponding to the sub-pixel region.

The metal patterns formed in this way may also act as pixel electrodes and a patterning process for forming the pixel electrodes can be omitted, thereby further simplifying the manufacturing procedure of the array substrate and reducing the cost of the array substrate.

Further, the array substrate is further provided with touch electrodes. The step of forming the multiple metal patterns in each pixel region of the array substrate further includes a step of forming the touch electrodes and the metal patterns simultaneously by one patterning process. Thus, the manufacturing procedure of the array substrate can be further simplified and the cost of the array substrate can be further reduced.

FIG. 4 is a schematic structure diagram of a reflective liquid crystal display panel according to some embodiments of the present disclosure. As shown in FIG. 4, the reflective liquid crystal display panel includes: an array substrate and a base substrate 104 arranged opposite to each other, a liquid crystal cell between the array substrate and the base substrate 104, and a polarizer 105 and an asymmetry forward scattering film 106 attached on the base substrate 104. The array substrate includes a base substrate 100 and multiple metal patterns formed on the base substrate 100, each metal pattern including multiple metal units 71. The metal patterns are made of a material with good conductivity, such as aluminum, gold, silver and copper. In view of cost and process compatibility, the metal patterns are preferably made of aluminum.

Figure 6:
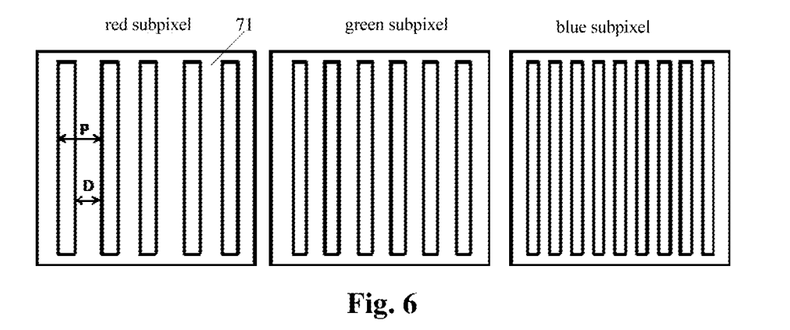
FIG. 6 is a schematic diagram of metal patterns within different sub-pixel regions according to some embodiments of the present disclosure.
Figure 7:
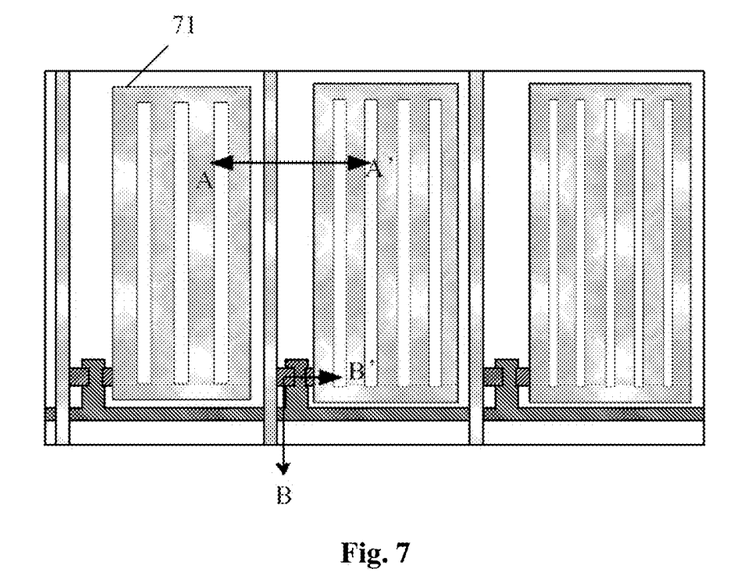
FIG. 7 is a schematic plan view of an array substrate according to some embodiments of the present disclosure.

As shown in FIG. 6 and FIG. 7, according to some embodiments of the present disclosure, in the array substrate of the display panel, multiple metal units are formed within each sub-pixel region. The multiple metal units, each being rectangular, are arranged periodically within the sub-pixel region. An arrangement period P of the multiple metal units is the sum of a distance between two adjacent metal units and a width D of each metal unit. The metal units corresponding to sub-pixel regions of different colors have different arrangement periods and different widths. Incident light from the ambient environment or from the front light source is reflected when reaching a surface of a periodic nano-array of metal units. Due to the excitation and the coupling effect of surface plasmons of the metal patterns, i.e., the resonance enhancement effect of the surface plasmons, for the metal units arranged at a certain period, only the reflection of a light having a specific wavelength is enhanced, while a light having other wavelength is absorbed and its energy is dissipated. Hence, the metal pattern can reflectively filter the light from the ambient environment or from the front light source.

As shown in FIG. 6, the array substrate includes a red sub-pixel region, a green sub-pixel region and a blue sub-pixel region. Metal units corresponding to a sub-pixel region of each color have a same width and a same arrangement period. When the incident lights reach a surface of the metal pattern within a sub-pixel region of a certain color, a light of a single color is reflected, so the single color e.g., red is displayed by the sub-pixel region. Likewise, metal units within the other two sub-pixel regions are respectively provided with widths and arrangement periods corresponding to green and blue, to form periodic arrays, thereby reflecting green light and blue light respectively and displaying in green and blue respectively by the other two sub-pixel regions. In this way, three sub-pixel regions of red, green and blue form a complete pixel unit.

Optionally, the array substrate may include a yellow sub-pixel region, a magenta sub-pixel region and a cyan sub-pixel region. Metal units of a metal pattern in a sub-pixel region of each color have a same width and a same arrangement period. When the incident lights reach a surface of the metal pattern in one sub-pixel region, a light of a single color is reflected, so the single color e.g., magenta is displayed in the sub-pixel region. Likewise, metal units within the other two sub-pixel regions are respectively provided with widths and arrangement periods corresponding to yellow and cyan, to form periodic arrays, thereby reflecting yellow light and the cyan light respectively and displaying in yellow and cyan respectively by the other two sub-pixel regions.

Figure 10:
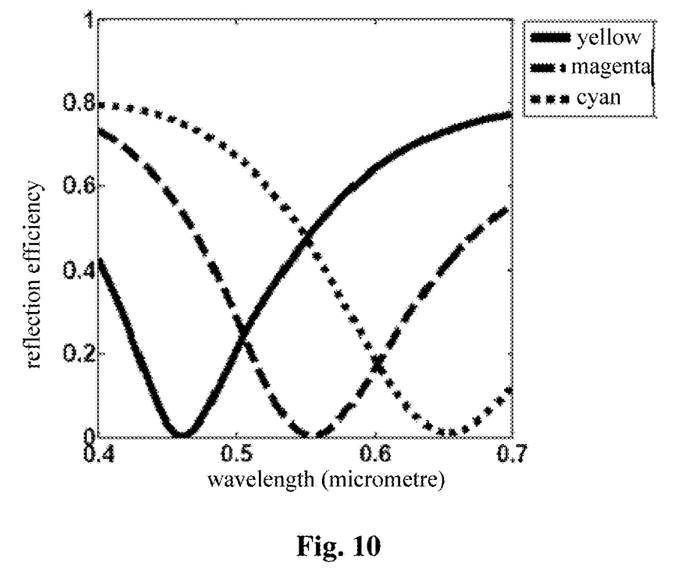
FIG. 10 is a schematic diagram of reflection efficiencies of a liquid crystal display panel according to some embodiments of the present disclosure.

In some embodiments of the present disclosure, in the case that the array substrate is provided with a yellow sub-pixel region, a magenta sub-pixel region and a cyan sub-pixel region, the metal patterns within the yellow sub-pixel region, the magenta sub-pixel region and the cyan sub-pixel region can reflect yellow light, magenta light and cyan light respectively, as shown in FIG. 10. It can be seen from FIG. 10, a reflection efficiency of the metal pattern within the yellow sub-pixel region in reflecting yellow light with a wavelength of 700 nm can reach approximately 80%, a reflection efficiency of the metal pattern within the magenta sub-pixel region in reflecting magenta light with a wavelength of 400 nm can reach 80%, and a reflection efficiency of the metal pattern within the cyan sub-pixel region in reflecting cyan light with a wavelength of 400 nm can exceed 70%; hence, the filtering efficiencies can be effectively improved compared with the color filters in related technique.

Figure 9:
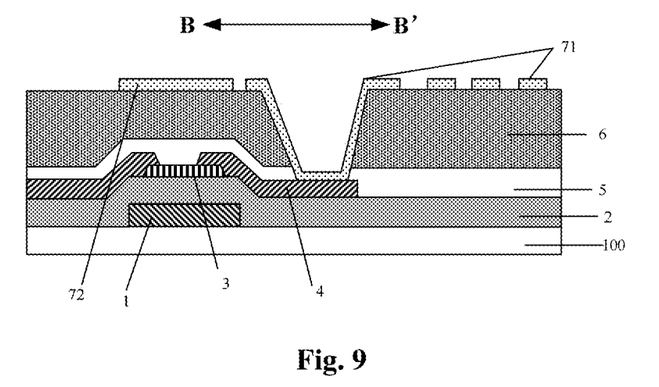
FIG. 9 is a sectional view showing the array substrate taken along line B-B' in FIG. 7.

Further, as shown in FIG. 9, the array substrate is further provided with multiple thin film transistors. The array substrate includes a gate metal layer 1 on the base substrate 100, a gate insulation layer 2, an active layer 3 on the gate insulation layer 2, and a source electrode and a drain electrode located on the active layer 3 and formed by a source and drain metal layer 4. Each metal unit 71 within one sub-pixel region can be connected to the drain electrode of a thin film transistor corresponding to the sub-pixel region. Thus, the metal pattern may also act as a pixel electrode, and a patterning process for forming the pixel electrode can be omitted, thereby further simplifying the manufacturing procedure of the array substrate and reducing the cost of the array substrate.

Specifically, a method for manufacturing an array substrate of a display panel according to some embodiments includes the following steps 1-6.

Step 1 is to deposit a gate metal layer 1 on a base substrate 100 and form patterns of gate electrodes and gate lines by a patterning process.

Step 2 is to deposit a gate insulation layer 2 on the base substrate 100 processed by step 1, deposit a semiconductor layer on the gate insulation layer 2, and form patterns of active layers 3 by a patterning process.

Step 3 is to deposit a source and drain metal layer 4 on the base substrate 100 processed by step 2 and form data lines, source electrodes and drain electrodes by a patterning process.

Step 4 is to deposit a passivation layer 5 on the base substrate 100 processed by step 3.

Step 5 is to deposit a planarization layer 6 on the base substrate 100 processed by step 4 and form patterns of the passivation layer 5 and the planarization layer 6 by a patterning process.

Step 6 is to deposit a metal layer on the base substrate 100 processed by step 5, and then pattern the metal layer using mask plates having different periods to form metal patterns respectively in sub-pixel regions of different colors, where metal units 71 of the metal patterns in the sub-pixel regions of different colors have different arrangement periods. The metal patterns can be implemented as reflective filters, and the metal patterns serving as reflective filters in the sub-pixel regions are electrically connected to drain electrodes of corresponding thin film transistors through via holes in the passivation layer 5 and the planarization layer 6, so that the metal patterns also function as pixel electrodes.

In the embodiments, the metal patterns are capable of reflectively filtering light from the ambient environment or from the front light source. Lights of different colors can be filtered out by designing the metal units with different widths and arranging the metal units according to different arrangement periods; hence, the metal patterns can function as a color filter layer and there is no need to prepare filters of different colors separately, the manufacturing procedure of the liquid crystal display can be simplified and the cost of the liquid crystal display can be reduced. Furthermore, the thickness of the display panel can be decreased since no additional color filter layer needs to be provided. The metal patterns also can function as pixel electrodes, so a patterning process for forming the pixel electrodes can be omitted, thereby further simplifying the manufacturing procedure of the array substrate and reducing the cost of the array substrate.

Figure 5:
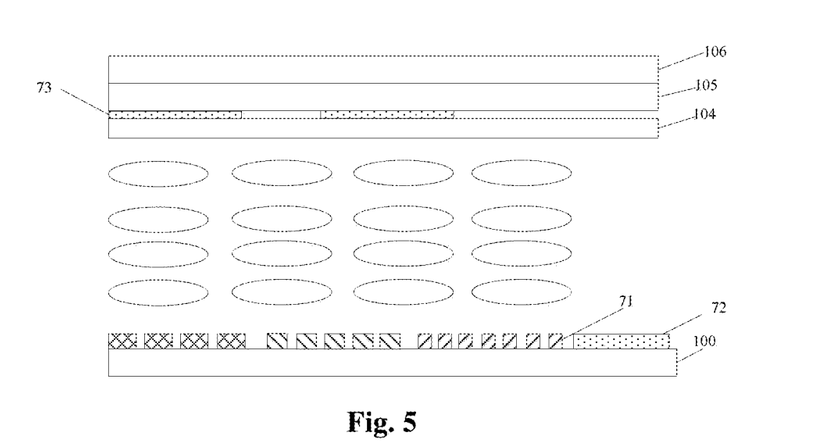
FIG. 5 is a schematic structure diagram of a touch panel according to some embodiments of the present disclosure.

FIG. 5 is a schematic structure diagram of a touch panel provided by some embodiments of the present disclosure. As shown FIG. 5, the touch panel includes an array substrate and a base substrate 104 arranged opposite to each other, a liquid crystal cell between the array substrate and the base substrate 104, and a polarizer 105 and an asymmetry forward scattering film 106 attached on the base substrate 104. Touch sensing electrodes 73 are formed on the base substrate 104. The array substrate includes a base substrate 100, and multiple metal patterns and a touch driving electrode 72 formed on the base substrate 100. Each metal pattern includes multiple metal units 71. The metal patterns and the touch driving electrode 72 are made of a material with good conductivity, such as aluminum, gold, silver and copper. In view of cost and process compatibility, the metal patterns and the touch driving electrode 72 are preferably made of aluminum. The touch driving electrode 72 and the metal patterns are located at a same layer and made of a same material, so the touch driving electrode 72 and the metal patterns can be formed simultaneously by one patterning process, thereby simplifying the manufacturing procedure of the array substrate and reducing the cost of the array substrate.

As shown in FIG. 6 and FIG. 7, according to some embodiments of the present disclosure, in the array substrate of the display panel, multiple metal units are formed within each sub-pixel region. The multiple metal units, each being rectangular, are arranged periodically within the sub-pixel region. An arrangement period P of the multiple metal units is the sum of a distance between two adjacent metal units and a width D of each metal unit. The metal units corresponding to sub-pixel regions of different colors have different arrangement periods and different widths. Incident light from the ambient environment or from the front light source is reflected when reaching a surface of a periodic nano-array of metal units. Due to the excitation and the coupling effect of surface plasmons of the metal patterns, i.e., the resonance enhancement effect of the surface plasmons, for the metal units arranged at a certain period, only the reflection of a light having a specific wavelength is enhanced, while a light having other wavelength is absorbed and its energy is dissipated. Hence, the metal pattern can reflectively filter the light from the ambient environment or from the front light source.

As shown in FIG. 6, the array substrate includes a red sub-pixel region, a green sub-pixel region and a blue sub-pixel region. Metal units of a metal pattern in a sub-pixel region of each color have a same width and a same arrangement period. When the incident lights reach a surface of the metal pattern, a light of a single color is reflected, so the single color e.g., red is displayed by the sub-pixel region. Likewise, metal units within the other two sub-pixel regions are respectively provided with widths and arrangement periods corresponding to green and blue, to form periodic arrays, thereby reflecting green light and blue light respectively and displaying in green and blue respectively by the other two sub-pixel regions. In this way, three sub-pixel regions of red, green and blue form a complete pixel unit.

Optionally, the array substrate may include a yellow sub-pixel region, a magenta sub-pixel region and a cyan sub-pixel region. Metal units of a metal pattern in a sub-pixel region of each color have a same width and a same arrangement period. When the incident lights reach a surface of the metal pattern in one sub-pixel region, a light of a single color is reflected, so the single color e.g., magenta is displayed in the sub-pixel region. Likewise, metal units within the other two sub-pixel regions are respectively provided with widths and arrangement periods corresponding to yellow and cyan, to form periodic arrays, thereby reflecting yellow light and the cyan light respectively and displaying in yellow and cyan respectively by the other two sub-pixel regions.

In some embodiments of the present disclosure, in the case that the array substrate is provided with a yellow sub-pixel region, a magenta sub-pixel region and a cyan sub-pixel region, the metal patterns according to the embodiments can reflect yellow light, magenta light and cyan light respectively, as shown in FIG. 10. It can be seen from FIG. 10, a reflection efficiency of the metal pattern within the yellow sub-pixel region in reflecting yellow light with a wavelength of 700 nm can reach approximately 80%, a reflection efficiency of the metal pattern within the magenta sub-pixel region in reflecting magenta light with a wavelength of 400 nm can reach 80%, and a reflection efficiency of the metal pattern within the cyan sub-pixel region in reflecting cyan light with a wavelength of 400 nm can exceed 70%; hence, the filtering efficiencies can be effectively improved compared with the color filters in related technique.

Figure 8:
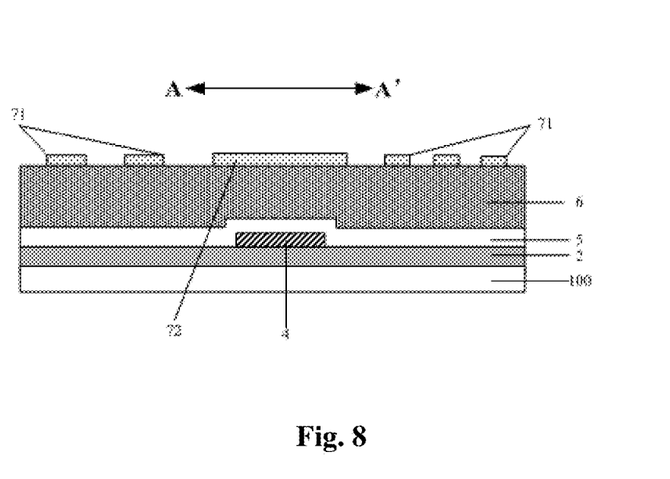
FIG. 8 is a sectional view showing the array substrate taken along line A-A' in FIG. 7.

Further, as shown in FIG. 8 and FIG. 9, the array substrate is further provided with multiple thin film transistors. The array substrate includes a gate metal layer 1 on the base substrate 100, a gate insulation layer 2, an active layer 3 on the gate insulation layer 2, and a source electrode and a drain electrode located on the active layer 3 and formed by a source and drain metal layer 4. Each metal unit 71 within one sub-pixel region can be connected to the drain electrode of a thin film transistor corresponding to the sub-pixel region. Thus, the metal pattern may also act as a pixel electrode, and a patterning process for forming the pixel electrode can be omitted, thereby further simplifying the manufacturing procedure of the array substrate and reducing the cost of the array substrate.

Specifically, a method for manufacturing an array substrate of a touch panel according to some embodiments includes the following steps 1-6.

Step 1 is to deposit a gate metal layer 1 on the base substrate 100 and form patterns of gate electrodes and gate lines by a patterning process.

Step 2 is to deposit a gate insulation layer 2 on the base substrate 100 processed by step 1, deposit a semiconductor layer on the gate insulation layer 2, and form patterns of active layers 3 by a patterning process.

Step 3 is to deposit a source and drain metal layer 4 on the base substrate 100 processed by step 2 and form data lines, source electrodes and drain electrodes by a patterning process.

Step 4 is to deposit a passivation layer 5 on the base substrate 100 processed by step 3.

Step 5 is to deposit a planarization layer 6 on the base substrate 100 processed by step 4 and form patterns of the passivation layer 5 and the planarization layer 6 by a patterning process.

Step 6 is to deposit a metal layer on the base substrate 100 processed by step 5, and then pattern the metal layer using mask plates having different periods, to form metal patterns respectively in sub-pixel regions of different colors and to reserve a mesh-like metal layer at positions corresponding to the gate lines, the data lines and thin film transistors. Metal units 71 of the metal patterns in the sub-pixel regions of different colors have different arrangement periods. The mesh-like metal layer can be partitioned to generate touch driving electrodes 72. The touch driving electrodes 72 and touch sensing electrodes 73 form touch structures.

Optionally, orthographic projections of the thin film transistors onto the array substrate are located within orthographic projections of the touch driving electrodes 72 onto the array substrate. Thus, the thin film transistors can be shielded by the touch driving electrodes 72 the property of the thin film transistors may not be influenced by light irradiation. Further, the arrangement of the touch driving electrodes 72 also can prevent leakage of light. The metal patterns can be implemented as reflective filters, and the metal patterns serving as reflective filters in the sub-pixel regions are electrically connected to drain electrodes through via holes in the passivation layer 5 and the planarization layer 6, so that the metal patterns also function as pixel electrodes.

In the embodiments, the metal patterns are capable of reflectively filtering light from the ambient environment or from the front light source. Lights of different colors can be filtered out by designing the metal units with different widths and arranging the metal units according to different arrangement periods; hence, the metal patterns can function as a color filter layer and there is no need to prepare filters of different colors separately, the manufacturing procedure of the liquid crystal display can be simplified and the cost of the liquid crystal display can be reduced. Furthermore, the thickness of the display panel can be decreased since no additional color filter layer needs to be provided. In the embodiments, the touch driving electrodes and the metal patterns are formed simultaneously by one patterning process, thereby further simplifying the manufacturing procedure of the array substrate and reducing the cost of the array substrate. The metal patterns also can function as pixel electrodes, so a patterning process for forming the pixel electrodes can be omitted, thereby further simplifying the manufacturing procedure of the array substrate and reducing the cost of the array substrate.

The above are merely preferred embodiments of the present disclosure. It should be noted that, a person skilled in the art may make improvements and modifications without departing from the principle of the present disclosure, and these improvements and modifications shall also fall within the scope of the present disclosure.

What is claimed is:

1. An array substrate, comprising a plurality of pixel regions arranged in an array,
   wherein a plurality of metal patterns is provided within each pixel region, each metal pattern comprises a plurality of metal units which is periodically arranged, and the plurality of metal patterns is configured to reflectively filter light from ambient environment or from a front light source;
   each pixel region comprises a plurality of sub-pixel regions which is in a one-to-one correspondence with the plurality of metal patterns within the pixel region, and metal units of metal patterns corresponding to sub-pixel regions of different colors have different arrangement periods;
   wherein the metal units are rectangular in shape, and the arrangement period of the metal units is a sum of a distance between two adjacent metal units and a width of the metal units;
   the array substrate further comprises red sub-pixel regions, green sub-pixel regions, and blue sub-pixel regions; and
   the metal units within each red sub-pixel region have a width ranging from 490 nm to 510 nm and an arrangement period ranging from 530 nm to 550 nm, the metal units within each green sub-pixel region have a width ranging from 440 nm to 460 nm and an arrangement period ranging from 475 nm to 495 nm, and the metal units within each blue sub-pixel region have a width ranging from 290 nm to 305 nm and an arrangement period ranging from 315 nm to 330 nm.

2. The array substrate according to claim 1, wherein the metal units within each red sub-pixel region have a width of 500 nm and an arrangement period of 540 nm, the metal units within each green sub-pixel region have a width of 450 nm and an arrangement period of 485 nm, and the metal units within each blue sub-pixel region have a width of 300 nm and an arrangement period of 320 nm.

3. The array substrate according to claim 1, wherein the metal units are circular in shape, and the arrangement period of the metal units is a sum of a minimum distance between two adjacent metal units and a diameter of the metal units.

4. The array substrate according to claim 1, wherein metal units have a thickness ranging from 100 nm to 220 nm.

5. The array substrate according to claim 4, wherein the thickness of the metal units is 120 nm.

6. The array substrate according to claim 4, further comprising a plurality of thin film transistors which respectively corresponds to the plurality of sub-pixel regions, and all metal units within each sub-pixel region are connected to a drain electrode of a thin film transistor corresponding to the sub-pixel region.

7. The array substrate according to claim 1, wherein adjacent metal units in the plurality of metal units corresponding to each sub-pixel region are connected with each other through a metal connection structure made of a same material as the metal units.

8. The array substrate according to claim 1, further comprising touch electrodes, wherein the touch electrodes and the metal patterns are located at a same layer and made of a same material.

9. The array substrate according to claim 8, further comprising a plurality of thin film transistors, wherein the touch electrodes are located above the thin film transistors, and orthographic projections of the thin film transistors onto the array substrate are located within orthographic projections of the touch electrodes onto the array substrate.

10. A display panel comprising the array substrate according to claim 1.

11. A touch panel comprising the array substrate according to claim 1.

12. A method for manufacturing an array substrate, wherein the array substrate comprises a plurality of pixel regions arranged in an array, a plurality of metal patterns is provided within each pixel region, each metal pattern comprises a plurality of metal units which is periodically arranged, the plurality of metal patterns is configured to reflectively filter light from ambient environment or from a front light source, each pixel region comprises a plurality of sub-pixel regions which is in a one-to-one correspondence with the plurality of metal patterns within the pixel region, metal units of metal patterns corresponding to sub-pixel regions of different colors have different arrangement periods, the metal units are rectangular in shape, the arrangement period of the metal units is a sum of a distance between two adjacent metal units and a width of the metal units, the array substrate further comprises red sub-pixel regions, green sub-pixel regions, and blue sub-pixel regions, and the metal units within each red sub-pixel region have a width ranging from 490 nm to 510 nm and an arrangement period ranging from 530 nm to 550 nm, the metal units within each green sub-pixel region have a width ranging from 440 nm to 460 nm and an arrangement period ranging from 475 nm to 495 nm, and the metal units within each blue sub-pixel region have a width ranging from 290 nm to 305 nm and an arrangement period ranging from 315 nm to 330 nm;

wherein the method comprises a step of: forming the plurality of metal patterns within each pixel region of the array substrate.

13. The method according to claim 12, wherein the array substrate further comprises a plurality of thin film transistors, and the step of forming the plurality of metal patterns within each pixel region of the array substrate comprises:

forming a plurality of metal units within each sub-pixel region, wherein each of the plurality of metal units is connected to a drain electrode of a thin film transistor corresponding to the sub-pixel region.

14. The method according to claim 12, wherein the array substrate further comprises touch electrodes, and the step of forming the plurality of metal patterns within each pixel region of the array substrate further comprises:

forming the touch electrodes and the plurality of metal patterns simultaneously by one patterning process.

15. An array substrate, comprising a plurality of pixel regions arranged in an array, wherein a plurality of metal patterns is provided within each pixel region, each metal pattern comprises a plurality of metal units which is periodically arranged, and the plurality of metal patterns is configured to reflectively filter light from ambient environment or from a front light source;

each pixel region comprises a plurality of sub-pixel regions which is in a one-to-one correspondence with the plurality of metal patterns within the pixel region, and metal units of metal patterns corresponding to sub-pixel regions of different colors have different arrangement periods;

wherein the metal units are rectangular in shape, and the arrangement period of the metal units is a sum of a distance between two adjacent metal units and a width of the metal units;

the array substrate further comprises yellow sub-pixel regions, magenta sub-pixel regions, and cyan sub-pixel regions; and the metal units within each yellow sub-pixel region have a width ranging from 50 nm to 70 nm and an arrangement period ranging from 190 nm to 210 nm, the metal units within each magenta sub-pixel region have a width ranging from 66 nm to 86 nm and an arrangement period ranging from 190 nm to 210 nm, and the metal units within each cyan sub-pixel region have a width ranging from 82 nm to 102 nm and an arrangement period ranging from 190 nm to 210 nm.

16. The array substrate according to claim 15, wherein the metal units within each yellow sub-pixel region have a width of 60 nm and an arrangement period of 200 nm, the metal units within each magenta sub-pixel region have a width of 76 nm and an arrangement period of 200 nm, and the metal units within each cyan sub-pixel region have a width of 92 nm and an arrangement period of 200 nm.

* * * * *